United States Patent [19]

Gordy

[11] 4,346,477

[45] Aug. 24, 1982

[54] PHASE LOCKED SAMPLING RADIO RECEIVER

[75] Inventor: Robert S. Gordy, Largo, Fla.

[73] Assignee: E-Systems, Inc., Dallas, Tex.

[21] Appl. No.: 820,866

[22] Filed: Aug. 1, 1977

[51] Int. Cl.$^3$ ............................ H04B 1/16; H03J 7/02
[52] U.S. Cl. .................................... 455/257; 455/260; 455/196; 455/314; 328/151; 331/2
[58] Field of Search ............... 325/418, 419, 420, 430, 325/433, 438, 442, 444, 480, 431, 432, 436, 434, 45; 328/15, 16, 151; 331/2, 14, 25–29; 307/352, 353, 523; 455/164, 173, 182, 192, 196, 209, 257, 258, 260, 265, 313–318, 323, 324

[56] References Cited

U.S. PATENT DOCUMENTS

| | | | |
|---|---|---|---|
| 2,771,546 | 11/1956 | Schock | 325/433 |
| 3,069,625 | 12/1962 | Morita | 325/433 |
| 3,084,327 | 4/1963 | Cutler | 325/45 |
| 3,320,547 | 5/1967 | Standford | 331/40 |
| 3,414,821 | 12/1968 | Bickers | 325/433 |
| 3,454,710 | 7/1969 | Gassmann | 325/444 |
| 3,619,789 | 11/1971 | Dejager | 325/480 |
| 3,665,304 | 5/1972 | Maybach | 324/140 |
| 3,717,816 | 2/1973 | Langer | 325/442 |
| 3,775,692 | 1/1973 | Azegami | 328/151 |
| 3,863,174 | 1/1975 | Klinger | 331/2 |
| 3,866,126 | 2/1975 | Cebula | 328/15 |
| 3,927,374 | 12/1975 | Nakaya | 328/151 |
| 3,959,601 | 5/1976 | Olevsky et al. | 325/433 |
| 4,035,732 | 7/1977 | Lohrmann | 325/489 |
| 4,053,836 | 10/1977 | Fellrath | 325/419 |
| 4,061,980 | 12/1977 | Sato | 325/433 |

Primary Examiner—Tommy P. Chin
Attorney, Agent, or Firm—Robert V. Wilder; Albert M. Crowder, Jr.

[57] ABSTRACT

A radio receiver is disclosed in which a received signal is amplified, filtered, and then sampled at a rate determined by a clock signal produced by a selectable-rate, digital oscillator. In sampling the received signal, a family of harmonics are generated which are distributed in a pattern determined by the sampling rate. One harmonic is selected as an intermediate frequency signal and, like the received signal, it is amplified, filtered, and sampled. The second sampling process is driven by a second clock signal produced by a variable-rate, digital oscillator. This produces a second family of harmonics which are derived from the intermediate frequency signal. The second clock signal rate is selected to produce one harmonic which has a carrier component centered on zero frequency. This harmonic, which is the desired baseband signal, is separated from the other harmonics by means of a low-pass filter. The baseband signal is amplified and provided to the user, while at the same time, it is passed through a narrow bandwidth, low-pass filter to extract the carrier component of the signal. The extracted carrier component is digitized to generate a signal that controls the frequency of the variable-rate, digital oscillator. This creates a phase locked loop wherein the variable-rate, digital oscillator generates a clock signal at a rate that maintains the carrier component of the baseband signal centered on zero frequency.

25 Claims, 10 Drawing Figures

PHASE LOCKED SAMPLING RADIO RECEIVER

FIELD OF THE INVENTION

The present invention relates to radio receivers and more particularly to such a receiver utilizing sampling techniques to effect frequency translation.

PRIOR ART

There are numerous advantages in using LSI (Large Scale Integration) circuits in the manufacturing of complex electronic equipment to replace conventional circuits that employ individual components or standard integrated circuit chips. The advantages of such use include low unit cost and consistent reproducibility for high volume production as well as a very high level of reliability for the final electronic product. LSI also lends itself well to the design of high-speed, digital circuitry.

Given the above characteristics, it would be particularly desirable to build a radio receiver that utilizes LSI circuits for performing the bulk of the electronic functions in the radio. The features of LSI are particularly desirable in the field of military radio systems where precision operation, light weight, reliability, low cost, and quality mass production are essential characteristics. However, there are serious drawbacks in the design of conventional radio receivers which prevent them from being converted to LSI structure.

A primary problem is the mixer element, a number of which are used in almost all radio circuit designs. Mixers utilize induction components, and this type of component cannot be produced as an integrated circuit, therefore, it must be manufactured as a separate component and interconnected with the remaining circuitry.

A second problem, which is present in phase coherent receivers that use phase locked loops, is the voltage controlled oscillator. This type of oscillator utilizes components such as varactors which have variable parameters. These components likewise cannot be easily manufactured with LSI.

Attempts have been made to overcome the above problems by digitizing the intermediate frequency signal and then processing the signal digitally. But, this technique still requires the use of at least one mixer to accomplish the frequency conversion from radio frequency to intermediate frequency. In addition, the analog-to-digital converter introduces substantial quantitization noise, and the limited speed of available digital logic for its implementation prevents use of the technique at higher frequencies.

An alternative approach to the mixer for accomplishing the frequency conversion function is digital sampling as described in U.S. Pat. No. 3,717,816 to Langer. Digital sampling circuits can be constructed with LSI, and can be operated at relatively high radio frequencies. Therefore, a need exists for a radio receiver design which utilizes digital sampling techniques and thereby can be manufactured almost totally with LSI circuits.

SUMMARY OF THE INVENTION

The present invention discloses a radio receiver design using digital sampling frequency conversion and in which the majority of the functional components can be manufactured in the form of large scale integrated circuits.

A radio receiver in accordance with the present invention comprises a first sampling circuit driven by a frequency-selectable digital oscillator, which is tunable to a number of receiving channels. The first sampling circuit converts the received signal to a number of subharmonics which are band-pass filtered to select a single subharmonic to serve as an intermediate frequency signal. The intermediate frequency signal is supplied to a second sampler which is driven by a second digital oscillator that is incorporated in a digital phase locked loop. Multiple subharmonics generated by the second sampler are passed through a low-pass filter which eliminates all but the baseband signal, which has a carrier component centered about zero frequency. The resulting baseband signal is passed through a narrow-band, low-pass filter to extract the carrier component which is digitized to generate a control signal that drives the second digital oscillator to complete the phase locked loop. Thus, the second digital oscillator generates a digital sampling clock signal at a rate which maintains the carrier component of the baseband signal phase locked to zero frequency.

Most of the functional components comprising the circuit of the present invention including amplifiers, filters, samplers, and the digital oscillators can be constructed and mass produced as large scale integrated circuits.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE PREFERRED EMBODIMENTS

Figures 1, 2, 3:
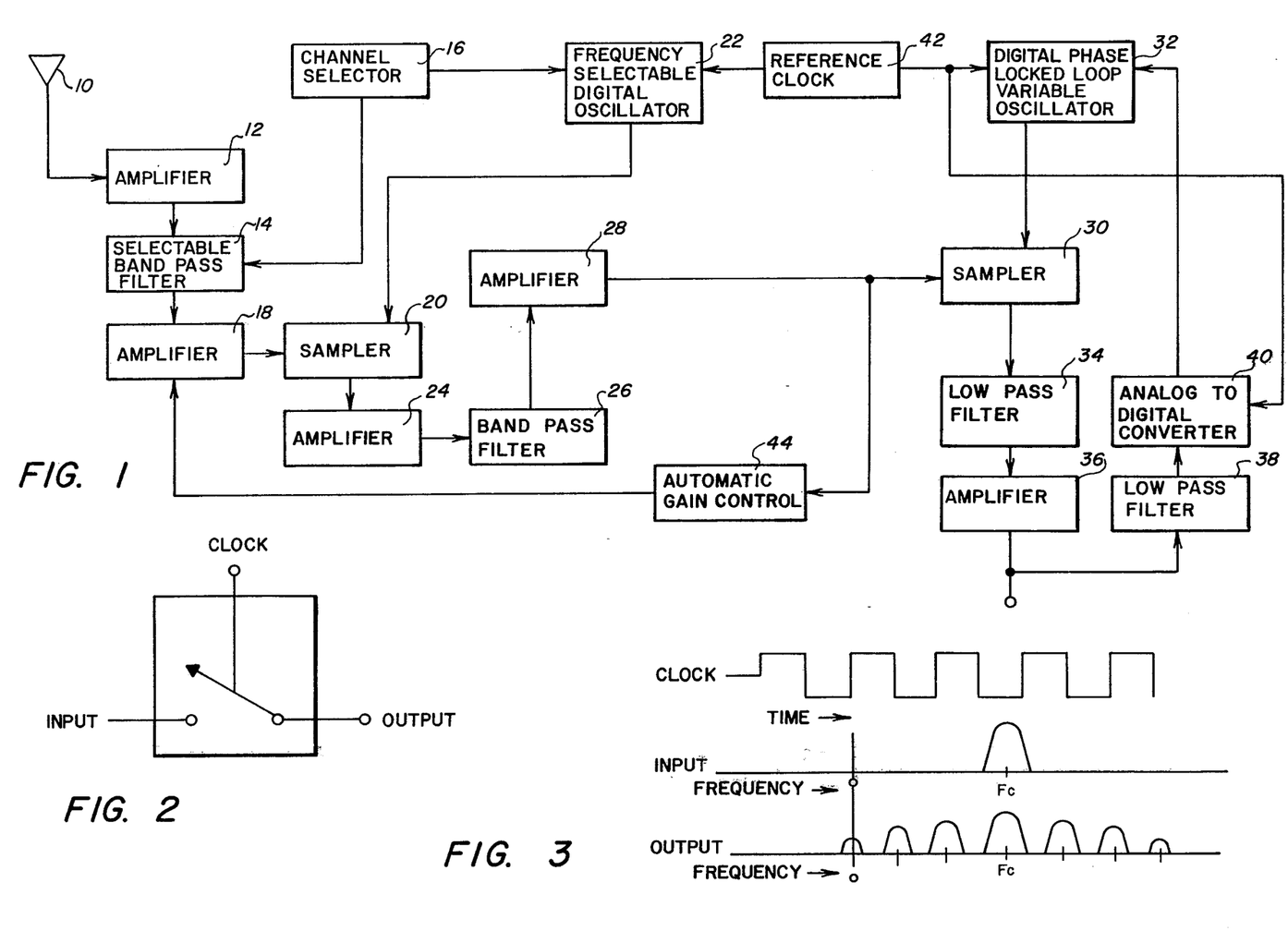
FIG. 1 is a block diagram illustrating a radio receiver in accordance with the present invention.
FIG. 2 is a schematic diagram of a harmonic sampler.
FIG. 3 illustrates selected waveforms associated with the harmonic sampler in FIG. 2.

A double conversion radio receiver in accordance with the present invention is illustrated in FIG. 1. A radio signal is captured by antenna 10 and passed through a low noise, high gain amplifier 12 to a selectable band-pass filter 14. A channel selector 16 determines the band which is to be passed by the selectable band-pass filter 14 to produce a band-limited signal. The band-limited signal is conveyed through an amplifier 18 to a sampler 20 which is driven by a clock signal produced by a frequency-selectable, digital oscillator 22. And, like the selectable band-pass filter 14, the frequency-selectable, digital oscillator 22 is controlled by the channel selector 16.

The sampler 20 generates from the input signal a band of harmonics which are passed through an amplifier 24 to a band-pass filter 26 that eliminates all but one of the harmonics produced by the sampler 20. The selected harmonic is designated as the intermediate frequency signal for the radio receiver. This intermediate frequency signal is passed through an amplifier 28 to a sampler 30, which is driven by a clock signal produced by a digital phase locked loop variable oscillator 32. In the same manner as sampler 20, the sampler 30 produces a band of harmonic signals which are transferred to a low-pass filter 34 that eliminates all but one harmonic. By using a low-pass filter, the harmonic selected is the one with the lowest frequency, and thus constitutes the receiver baseband signal. Once extracted, the baseband signal is passed through an amplifier 36 to provide the appropriate amplitude level for the user of the output data. If the radio receiver is processing digital data with phase or frequency shift modulation, the baseband signal from amplifier 36 can be transferred to a data matched filter for generating a digital signal. But if analog data such as voice is being received, the output of amplifier 36 is sent to a speaker.

The baseband signal is also passed through a low-pass filter 38 to extract the carrier component of the baseband signal by blocking the higher frequency information component. A representative value for low-pass filter 38 is 300 Hz. After it is extracted, the carrier component is digitized in an analog-to-digital converter 40 which generates a control signal that is transmitted to the digital phase locked loop variable oscillator 32.

The carrier component of the baseband signal ideally is centered at zero frequency by the translating process of sampling. This insures that the information signal is of the correct frequency and that the carrier will not introduce interference into the output data. The analog-to-digital converter 40 detects any change in voltage from the low-pass filter 38, any voltage change being a shift in frequency of the carrier away from zero frequency. Both the polarity and magnitude of the change are detected by the analog-to-digital converter 40, but only the polarity is used in this embodiment to generate the control signal that varies the rate of the clock signal generated by the digital phase locked loop variable oscillator 32. This clock signal in turn controls the sampling rate of sampler 30. Thus, any drift of the carrier component away from zero frequency causes the sampling rate to vary and shift the carrier component back to zero.

The digital phase locked loop sampling technique described above insures that the received signal is constantly tracked despite changes in frequency. Factors which can cause the received signal to vary in frequency include Doppler shift, unstable transmitter or receiver oscillators, and variations in component parameters due to aging or temperature fluctuation. Failure to track the changing carrier frequency of the received signal can cause distortion or even complete loss of the baseband signal. In particular, if there is frequency drift in an analog voice system, it is possible for the carrier component to become an audible tone that interferes with the voice signal.

A stable frequency clock signal is provided by the reference clock 42 to both the frequency-selectable, digital oscillator 22 and the digital phase locked loop variable oscillator 32. Reference clock 42 provides the precision frequency signals and timing signals for all operations in the radio receiver. Thus, reference clock 42 is the only item requiring calibration in the receiver. This provides a substantial reduction in complexity over previous designs which have numerous oscillators and filters that must be periodically calibrated. In this embodiment, reference clock 42 is a temperature controlled crystal oscillator.

In order to maintain a constant amplitude output signal, the intermediate frequency signal at the output of amplifier 28 is provided to an automatic gain control circuit 44 which detects the level of the intermediate frequency signal and controls the gain of the amplifier 18 so as to maintain the level of the intermediate frequency signal input to the sampler 30 within predetermined limits.

As a numerical example of the double conversion receiver of FIG. 1, a radio frequency channel centered at 380 MHz with an information bandwidth of 15 MHz will be assumed. With such a system, a typical value for the frequency-selectable band-pass filter 14 is 30 MHz. Sampler 20 operates at a rate of 60 MHz to produce a fourth harmonic component centered at 140 MHz. For this example, 140 MHz is designated as the intermediate frequency. Band-pass filter 26 is selected as having a bandwidth of 15 MHz and sampler 30 is driven at a basic rate of 35 MHz to produce a fourth harmonic centered at zero frequency. This harmonic is separated from others produced in the sampling process by passing the output of sampler 30 through a low-pass filter having a 15 MHz bandwidth. Thus, the output of low-pass filter 34 is the desired 15 MHz bandwidth information signal.

The samplers 20 and 30 shown in FIG. 1 can be either of two types, harmonic or balanced. A schematic diagram of a harmonic sampler is shown in FIG. 2. This is illustrated as being a conventional mechanical switch for ease of understanding, but as actually implemented the circuit is a solid state device, more particularly, an FET (Field Effect Transistor) switch. The signal input on the clock line operates to open and close the switch arm so as to connect the input line to the output line in synchronism with the clock pulses.

The clock pulses which drive the harmonic sampler shown in FIG. 2 are illustrated in FIG. 3 together with frequency spectrum representations for both the input and output signals of the sampler. The spectrum of the input signal as shown is centered on the frequency $F_c$. At its output, the sampler produces a series of positive and negative harmonics of the input signal. These harmonics are translated in frequency by odd multiples of the clock signal rate when the sampling signal, as with the subject embodiment, is a symmetrical square wave. For example, if the input signal has a carrier frequency of 400 MHz and the sampling rate is 35 MHz, the harmonics will be centered at 435 MHz, 365 MHz, 470 MHz, 330 MHz, 505 MHz, 295 MHz, etc.

The clock rate of the sampler must be sufficiently high to prevent overlap between the harmonics of the output signal. Wide bandwidth signals require higher sampling rates to prevent overlap than do narrower bandwidth signals. The sampling rate must be set to a particular rate so as to produce a harmonic at the desired translation frequency. In the case of sampler 20, the frequency is selected so as to place a harmonic at the predetermined intermediate frequency. For the sampler 30, a rate is selected that centers one of the harmonics of the intermediate frequency signal at zero frequency.

The spectrum harmonics are separated and selected by the band-pass filter 26 and the low-pass filter 34 for the samplers 20 and 30, respectively. Note in FIG. 3 that the harmonics are reduced in amplitude in proportion to the degree of frequency translation from the input signal frequency.

Figure 4:
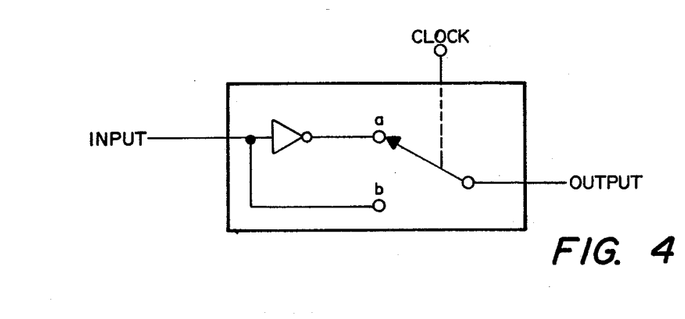
FIG. 4 is a schematic diagram of a balanced sampler.

The second type, the balanced sampler, is illustrated in FIG. 4. This sampler likewise is illustrated as a mechanical embodiment for greater clarity and it also is constructed as an FET solid state switch. The clock signal in this sampler drives the switch arm so as to alternately connect the output terminal to the contacts A and B. An inverter is located between the input terminal and the contact A while the contact B is directly connected to the input.

Figure 5:
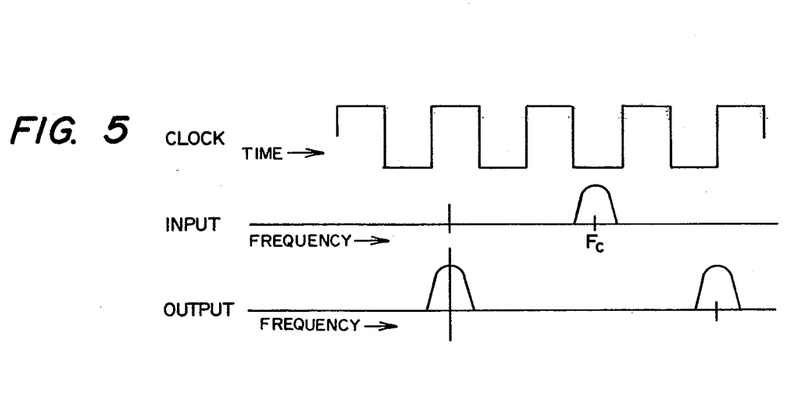
FIG. 5 illustrates selected waveforms associated with the balanced sampler in FIG. 4.

The various waveforms associated with the balanced sampler shown in FIG. 4 are illustrated in FIG. 5. The clock signal operates as previously described to selectively connect the output terminal to the inverted input signal, present at contact A, and the non-inverted signal present at contact B. Ideally, the transition from one contact to another is made with no loss of time, and although this is impossible to achieve, it can be approached very closely with actual circuitry so as to achieve very good results. The balanced sampler shown in FIG. 4 differs in its operation from the unbalanced sampler shown in FIG. 2 in that, rather than producing various subharmonics, the output comprises only two signals, which are translated in frequency by the clock sampling rate. Frequency spectrums for both the input and output signals of the balanced mixer are shown in FIG. 5. The output comprises the input signal translated by both a positive and a negative value of the sampling rate. The degree of translation is determined by the frequency of the sampler. For the embodiment of the sampler 20, the rate would be set so as to produce a converted signal at the desired intermediate frequency, but for the sampler 30, the rate would be set so as to translate the input signal to zero frequency, thereby generating the desired baseband output with the carrier component eliminated. The output signals which are not desired are eliminated by the band-pass and low-pass filters implemented in the embodiment of FIG. 1 as noted above.

The sampling procedure described above is a physical embodiment of the mathematical technique termed convolution. As embodied in this invention, the input signal is convolved with the sampling clock signal to generate the output signal. This procedure is described in "Signals, Systems and Communications" by B. P. Lathi, published by John Wiley & Sons, Inc., Copyright 1965.

The rate at which the input signal is sampled must be at least twice the bandwidth of the input signal. This bandwidth is controlled by the filters preceding the samplers, selectable band-pass filter 14 for sampler 20 and band-pass filter 26 for sampler 30. Thus, as these filters are made narrower, a lower sampling rate can be used. In this embodiment, band-pass filter 26 will have a narrower bandwidth than selectable band-pass filter 14, therefore sampler 30 can operate at a lower sampling rate than sampler 20.

Figure 6:
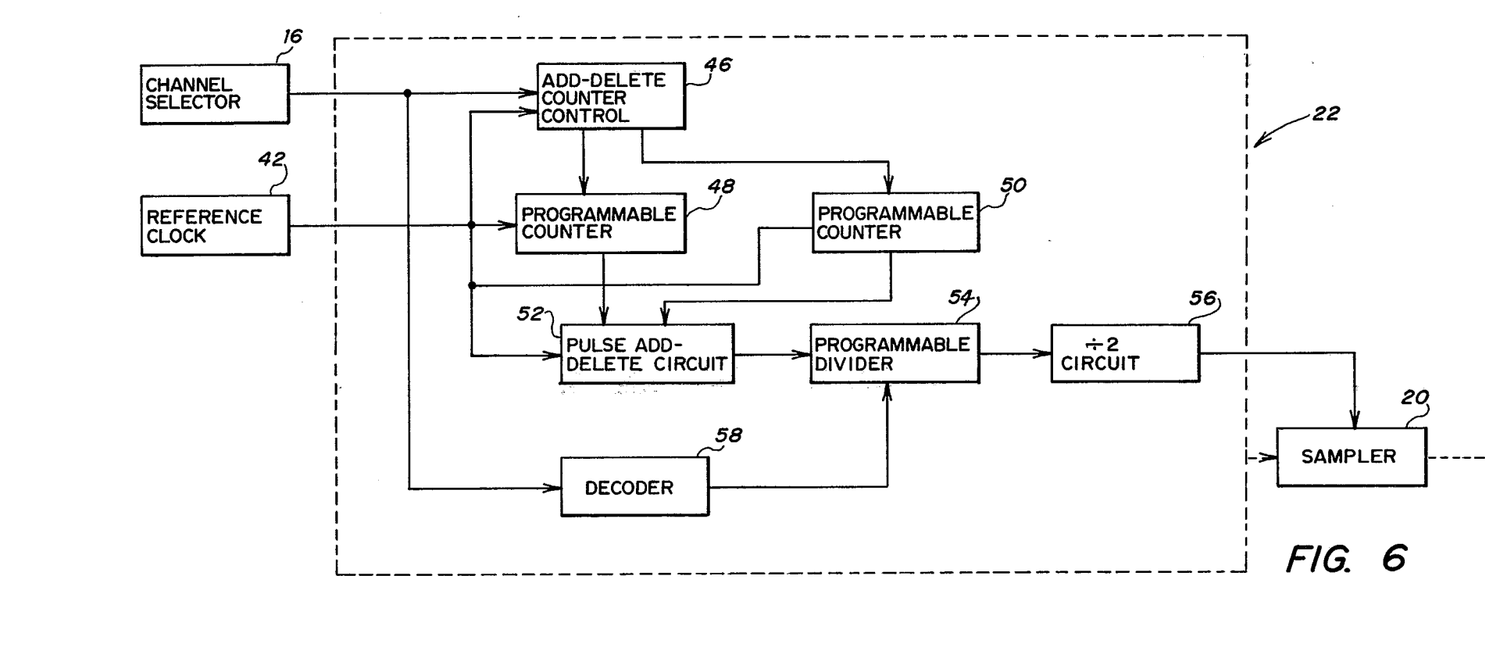
FIG. 6 is a block diagram of a frequency-selectable digital oscillator used in the block diagram shown in FIG. 1.

The frequency-selectable, digital oscillator 22, shown in FIG. 1, is illustrated in block diagram form in FIG. 6. This oscillator generates the clock signal that drives the sampler 20, based on the control signal provided by the channel selector 16 and the clock signal provided by the reference clock 42. Frequency-selectable, digital oscillator 22 provides the means for selecting the radio frequency that is received by the radio receiver. An operator sets the channel selector 16 to the radio frequency that he desires to receive.

The channel selector 16 provides to an add-delete counter control circuit 46 a control signal specifying the desired radio frequency. A clock signal is provided by the reference clock 42 to programmable counters 48 and 50, add-delete counter control circuit 46, and to a pulse add-delete circuit 52. The pulse signal generated by the pulse add-delete circuit 52 is provided to a programmable divider 54 which in turn delivers a pulse train signal to a divide-by-two circuit 56 that generates the clock signal provided to the sampler 20. A decoder 58 converts the channel selector 16 signal to a particular integer that determines the divide ratio in the programmable divider 54.

Frequency-selectable, digital oscillator 22 generates the clock signal which drives the sampler 20 that translates the received signal from its carrier frequency to the predetermined intermediate frequency. Thus, the clock rate determines the carrier frequency that will be received and processed by the radio receiver. The control signal provided by the channel selector 16 is decoded by the add-delete counter control circuit 46 into a pair of integers, one of which is provided to the programmable counter 48 and the other is provided to the programmable counter 50. For each channel there is a predetermined set of integers. These counters generate a single pulse output after the number of clock pulses received equals the stored integer. This process can produce a wide spectrum of clock frequencies all derived from a single frequency source. Pulses generated by the programmable counters 48 and 50 are provided to the pulse add-delete circuit 52 as control signals with the output of programmable counter 48 being an add control signal and the output of programmable counter 50 being a delete control signal. Operation of these control signals is included in the later description of the pulse add-delete circuit 52.

In the pulse add-delete circuit 52, which is further described below, the input reference clock signal is used to generate both a 0 degree phase shifted clock signal and a 180 degree phase shifted clock signal, both at the same rate as the reference clock, but with reduced pulse widths. Clock signals at varying average pulse rates are generated by the pulse add-delete circuit 52 by transmitting the 0 degree and 180 degree clock signals in response to the add and the delete control signals. Thus, a wide range of frequencies can be generated with relatively small steps between frequencies.

The output of the pulse add-delete circuit 52 is provided to a programmable divider 54 which generates a single pulse output after receiving a programmed number of pulses. Following this division, the subdivided clock signal is then conveyed to a divide-by-two circuit 56 which generates the clock signal that drives the sampler 20.

Programmable divider 54 provides gross frequency selection through the integer programmed into it while the programmable counters 48 and 50 provide fine frequency control by means of the integers programmed into them.

Frequency-selectable, digital oscillator 22 illustrated in FIG. 6 performs as a frequency synthesizer to generate a wide range of clock frequencies derived from a single frequency, precision clock source. It is important that the precision clock source, reference clock 42, generate a signal which is at a much higher frequency than the clock signal that drives the sampler 20. This condition is necessary in order to derive a relatively phase-stable clock signal from the irregularly spaced pulses generated by the pulse add-delete circuit 52. Phase stability is enhanced by the frequency division provided by the programmable divider 54 and the divide-by-two circuit 56. Phase stability, however, is ultimately dependent upon the ratio of the rate of the reference clock 42 to the clock rate provided to the sampler 20. Thus, stability is enhanced by increasing the reference clock rate while increasing the division number.

Figure 7:
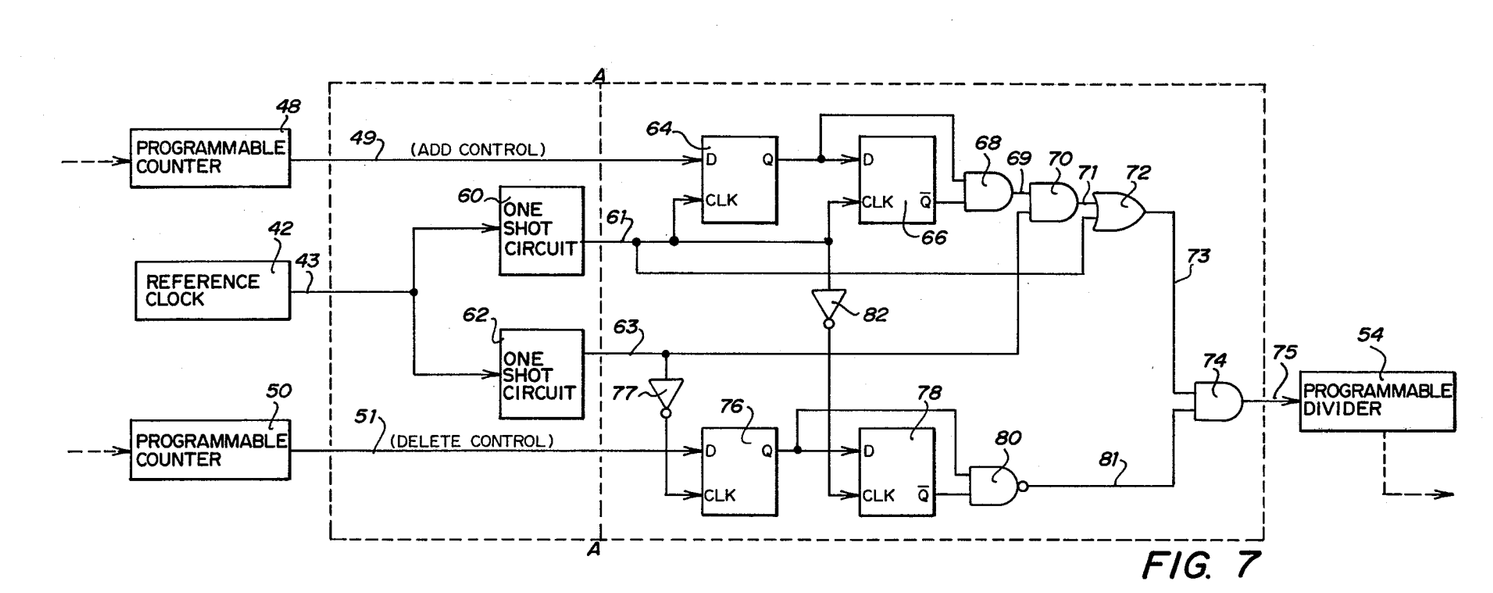
FIG. 7 is a schematic diagram of the pulse add-delete circuit used in the block diagram shown in FIG. 6.

The pulse add-delete circuit 52 is shown in a schematic diagram in FIG. 7 along with its interconnecting functional blocks. Variation in the rate of the clock signals transmitted to the samplers 20 and 30 is provided by the add-delete circuit 52. The reference clock 42 provides a clock input to a first one-shot circuit 60 and a second one-shot circuit 62. One-shot circuit 60 produces on line 61 a pulse for every positive transition of the reference clock signal received on line 43. In a similar fashion, the one-shot circuit 62 generates a pulse for every negative transition of the reference clock signal, thereby producing a clock signal shifted 180 degrees from the reference clock. These clock signals are shown in the waveforms illustrated in FIG. 8. The numbered waveforms correspond to the signals carried on the like numbered lines. Thus, line 61 carries 0 degree phase shifted clock pulses while line 63 carries 180 degree phase shifted clock pulses in relation to the reference clock signal carried on line 43.

The 0 degree clock pulses on line 61 provide the clock timing inputs for flip-flops 64 and 66. Programmable counter 48 generates an add control signal on line 49 which is conveyed to the D input of the flip-flop 64. The Q output of flip-flop 64 is provided to the D input of flip-flop 66 and to a first input of an AND gate 68. A second input to the AND gate 68 is provided by the $\overline{Q}$ output of flip-flop 66. The output of the AND gate 68 is conveyed to a first input of the AND gate 70 and the 180 degree pulses on line 63 are provided as the second input to AND gate 70. An exclusive-OR gate 72 has the output of AND gate 70 as a first input and the 0 degree clock signal on line 61 as a second input. The output of the exclusive-OR gate 72 is provided as a first input to an AND gate 74, which generates on line 75 the input signal to the programmable divider 54.

The programmable counter 50 generates a delete control signal on line 51 which is conveyed to the D input of flip-flop 76. A clock input is provided to flip-flop 76 from the one-shot circuit 62 through an inverter 77. The Q output of flip-flop 76 is provided to the D input of a flip-flop 78 and to a first input of a NAND gate 80. An inverter 82 has the 0 degree clock signal on line 61 as an input and supplies a clock signal to the flip-flop 78. The output of the NAND gate 80 is provided as the second input to the AND gate 74.

The output of the pulse add-delete circuit 52 on line 75 is a clock signal with three possible output conditions. These conditions are (1) clock pulses at the reference clock rate, (2) clock pulses at double the reference clock rate, and (3) no clock pulses. The first condition occurs when neither the add control line 49 nor the delete control line 51 is activated. This is shown under bracket "A" of waveform 75 in FIG. 8. The second condition occurs when the add control line 49 alone is activated, and is illustrated as the segment of waveform 75 under bracket "B". And, the third condition occurs when only the delete control line 51 is activated. This is as shown under bracket "C" of waveform 75. Thus, control line 49 causes pulses to be added to the sampling clock signal while control line 51 causes pulses to be deleted from the sampling clock signal.

Referring to FIG. 7, a reference clock rate signal is produced on line 75 when both lines 49 and 51 have low levels. When the D input to flip-flop 64 is low, the Q output is also low which drives the $\overline{Q}$ output of flip-flop 66 high. This in turn forces the output of the AND gate 68 low which drives the output of AND gate 70 low. Therefore, the output of the exclusive-OR gate 72 is the 180 degree pulse train carried on line 61. With a low level on line 51 the Q output of flip-flop 76 is low which sets the $\overline{Q}$ output of flip-flop 78 high, and this in turn generates a high output on line 81 which is provided as a second input to the AND gate 74. Under these conditions the output on line 75 is the 180 degree pulse train generated by the one-shot circuit 62. This is the portion of the waveform for line 75 under the bracket "A" in FIG. 8.

Figure 8:
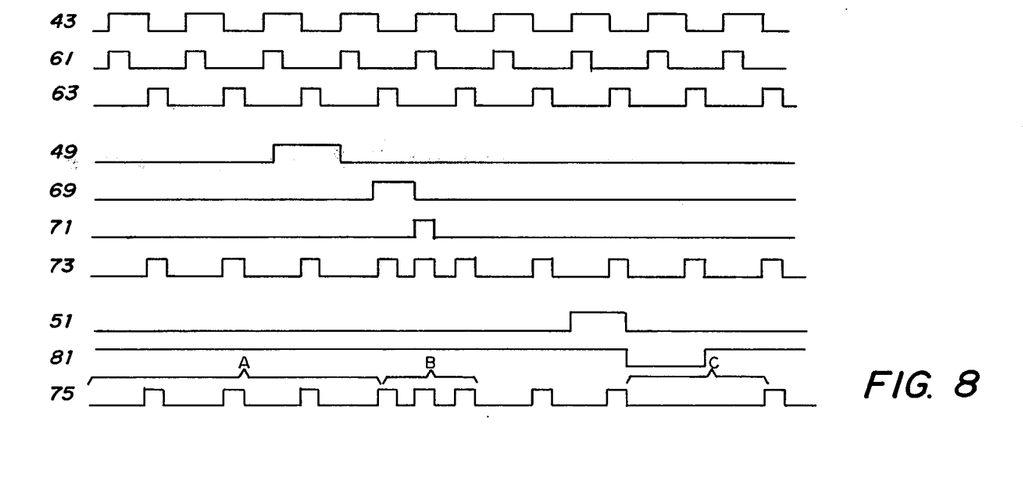
FIG. 8 illustrates a set of waveforms representing signals present in the circuit shown in FIG. 7.

When a pulse is received on line 49, as shown in FIG. 8, the Q output of flip-flop 64 goes high upon receipt of the next clock pulse on line 61. This supplies a high level input to the D terminal of flip-flop 66 which forces the $\overline{Q}$ output of this flip-flop to a low level upon receipt of the next clock pulse also from line 61. However, before this next clock pulse is received, both of the inputs to the AND gate 68 are high, therefore a high level output is generated. This high level on line 69 in turn causes the AND gate 70 to generate an output when the next pulse of the 180 degree clock signal arrives on line 63. The 180 degree pulse is passed through the exclusive-OR gate 72 and added to the pulse stream on line 75, as shown under bracket "B". Thus, a single pulse is added to line 75 for each pulse received on line 49.

When a pulse is received on line 51, as shown in FIG. 8, the Q output of the flip-flop 76 is driven to a high level upon receipt of the next clock pulse from inverter 77. A high level on the Q output of flip-flop 76 provides a high level input to the NAND gate 80 and upon receipt of the next clock input to the flip-flop 78, converts the $\overline{Q}$ output of flip-flop 78 to a low level. But until this clock pulse is received, both of the inputs to the NAND gate 80 are high therefore the signal level on line 81 is low. This in turn deactivates the AND gate 74, forcing its output to a low level, thus preventing any pulses from being output on line 75. This condition, however, exists only for one clock period, therefore only one pulse is deleted. This is as shown under the bracket "C" for line 75 in FIG. 8.

Figure 9:
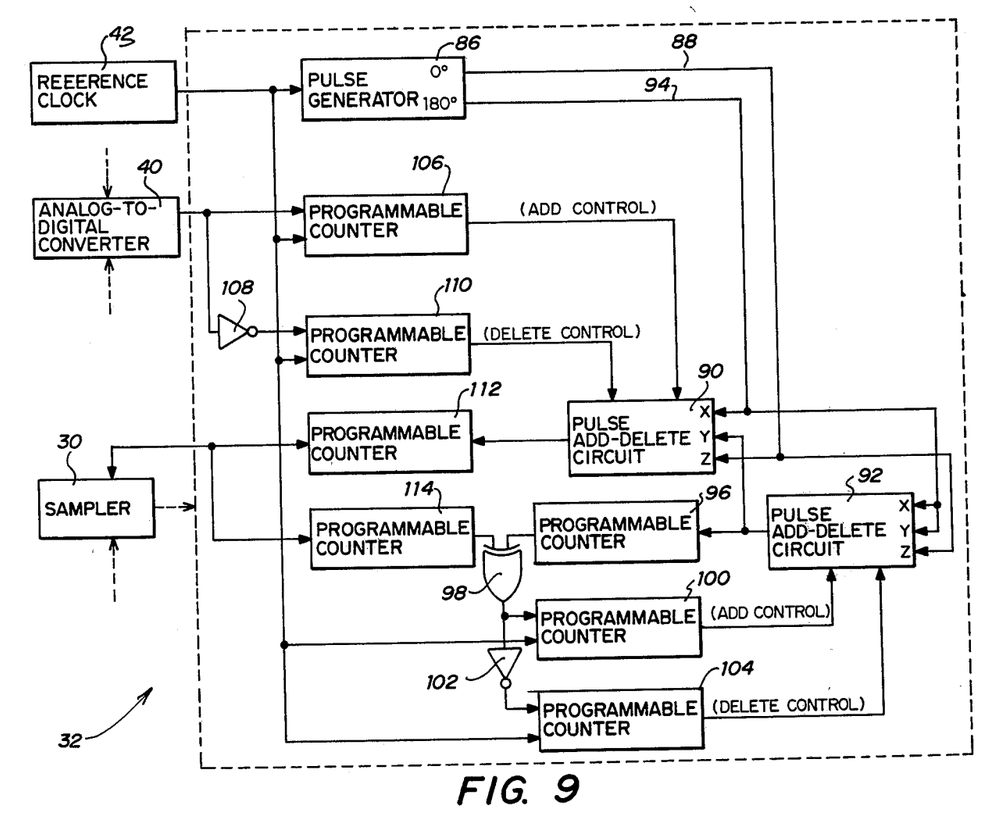
FIG. 9 is a block diagram of a digital phase locked loop variable oscillator used in the block diagram shown in FIG. 1.

The digital phase locked loop oscillator 32, as noted above, is illustrated in block diagram form in FIG. 9. Reference clock 42 provides a clock signal that is input to a pulse generator 86 which generates a 0 degree phase shift clock signal, in-phase, and a 180 degree phase shift, out-of-phase, clock signal with both pulse trains at the reference clock rate. The 0 degree pulse train on line 88 is provided to the Z input of pulse add-delete circuits 90 and 92, which are that part of the pulse add-delete circuit 52 in FIG. 7 to the right of the line A—A. The 180 degree clock signal on line 94 is provided to the X input of the pulse add-delete circuit 90 and to the X and Y inputs of the pulse add-delete circuit 92. An output pulse train is provided by the pulse add-delete circuit 92 to a programmable counter 96 which provides a first input to an exclusive-OR gate 98. The output from the exclusive-OR gate 98 is conveyed to a programmable counter 100 and through an inverter 102 to a programmable counter 104. An add control signal is generated by the programmable counter 100 and is supplied to the pulse add-delete circuit 92. A delete control signal is generated by the programmable counter 104 and supplied to the pulse add-delete circuit 92.

The analog-to-digital converter 40 provides an input to a programmable counter 106 and an input through an inverter 108 to a programmable counter 110. Pulse add-delete circuit 90 receives an add control signal from the programmable counter 106 and a delete control signal from the programmable counter 110.

The pulse add-delete circuit 90 generates a pulse train which is subdivided by the programmable counter 112 that supplies a clock signal to the sampler 30 and an input to a programmable counter 114. A second input to the exclusive-OR gate 98 is provided by the programmable counter 114.

Digital phase locked loop variable oscillator 32 generates the clock pulses for driving the sampler 30, which in turn frequency translates the intermediate frequency signal. The input to the analog-to-digital converter 40 is the carrier component of the baseband signal. Converter 40 detects any drift, either positive or negative, away from zero frequency and generates an appropriate drift signal. Digital phase locked loop variable oscillator 32, in response to these drift signals, changes the frequency of the clock signal so as to maintain the carrier component of the baseband signal centered on zero frequency. This operation is accomplished in the form of a digital, phase locked loop. When a positive drift signal is received from the programmable counter 106, an add control pulse is generated after a predetermined number of reference clock pulses have been received. These pulses cause the pulse add-delete circuit 90 to insert additional pulses into the clock driver for the sampler 30. This higher frequency clock rate causes the carrier component to shift back to zero frequency. In a like fashion, when a negative drift is detected the programmable counter 110 generates delete control pulses which cause the pulse add-delete circuit 90 to remove pulses from the pulse train that generates the clock signal driving the sampler 30. This action likewise causes the translated carrier component of the baseband signal to shift back to zero frequency. The carrier component of the baseband signal is forced back toward zero frequency whenever it drifts away from zero. In this embodiment the analog-to-digital converter 40 produces a two state control signal, one state drives the carrier to a higher frequency while the other drives the carrier to a lower frequency. Since there is no static state, the carrier is constantly crossing back and fourth across zero frequency, in effect, oscillating. The frequency of this oscillation is determined by the divisor numbers of the programmable counters 86, 106, 100, and 104, and the oscillation frequency is inversely proportional to the divisor numbers. Thus, for higher programmed divisor numbers, the lower the oscillation frequency.

The remaining circuitry in the digital phase locked loop variable oscillator 32 is utilized as a second order phase locked loop for damping the rise time of the sampling clock signal to thereby provide greater system stability. The primary pulse train for the sampler 30 is the 180 degree clock signal pulses on line 94 which pass to the Y input of the pulse add-delete circuit 92 and thence to the Y input of the pulse add-delete circuit 90 through the programmable counter 112 and finally to the sampler 30. Thus, the source of pulses for the add-delete circuit 90 is the pulse add-delete circuit 92. Programmable counters 114 and 96 compare the output pulse stream that drives the sampler 30 to the input pulse stream to the pulse add-delete circuit 90. When these pulse trains are identical the exclusive-OR circuit 98 has a low output. But, when these pulse trains differ it has a high output. These differing output levels activate the programmable counters 100 and 104 which respectively activate the pulse add and pulse delete control lines to the pulse add-delete circuit 92. Thus, when the analog-to-digital converter 40, which operates in a step mode, causes the pulse add-delete circuit 90 to increase or decrease the clock rate to the sampler 30, this change in rate is detected by the exclusive-OR gate 98 which activates the appropriate control lines to the pulse add-delete circuit 92 to somewhat counteract the thrust of the frequency change and therefore smooth out the operation of the system to make it more stable.

Digital phase locked loop oscillator 32 performs the equivalent function of a voltage controlled oscillator in a conventional phase locked loop. However, oscillator 32 provides an advance over voltage controlled oscillators because it is an all digital device, its frequency accuracy is derived from a separate source, and it can be completely manufactured as a portion of an LSI circuit.

Figure 10:
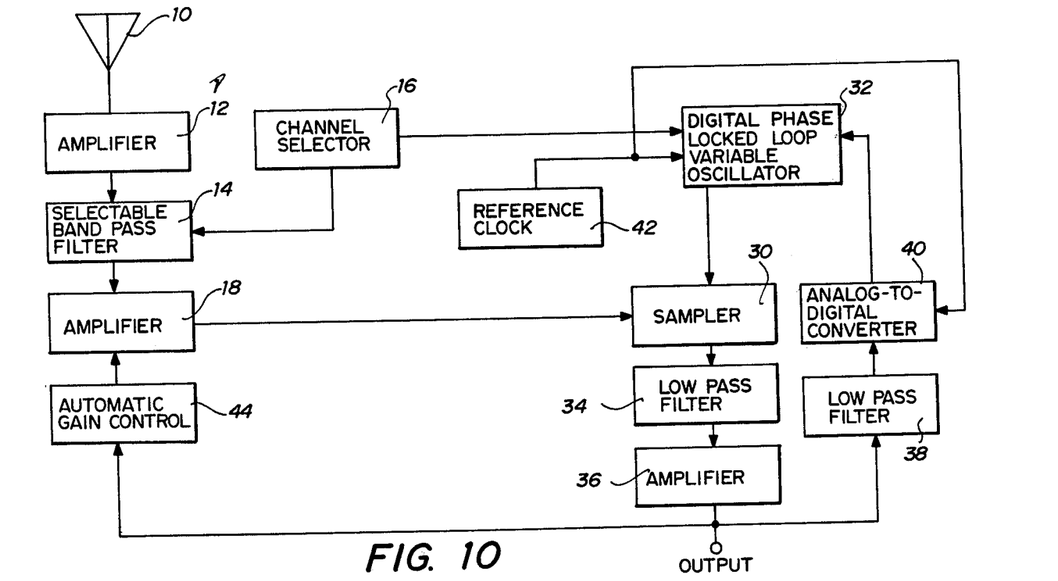
FIG. 10 is a block diagram of a single frequency conversion radio receiver in accordance with the present invention.

An alternative embodiment of the present invention is illustrated in FIG. 10. This embodiment is a single conversion radio receiver as opposed to the double conversion receiver illustrated in FIG. 1. The operation is the same as that described for FIG. 1 but with the exception that there is no intermediate frequency signal. The incoming radio frequency signal is directly translated to the baseband frequency from which is extracted the carrier component that drives the digital feedback loop. Digital phase locked loop variable oscillator 32 is stepped in frequency by channel selector 16 to select the desired radio frequency that is to be received and processed. And like the embodiment in FIG. 1, the output from amplifier 36 can be transferred to a speaker for an analog voice system, passed through a data matched filter for a phase or frequency shift system, or used otherwise as in conventional communications systems. The remaining operations of the functional elements of this embodiment are essentially the same as that of the embodiment of FIG. 1.

The automatic gain control 44 in the single conversion receiver monitors the amplitude of the baseband signal as opposed to the double conversion receiver in which the automatic gain control 44 monitors the amplitude of the intermediate frequency signal.

In the embodiments described above, the carrier component of the baseband signal is phase locked to zero frequency. However, the carrier component can be phase locked to a signal of any frequency. If this frequency is relatively low, the effect on the received information signal can be negligible. But, if the carrier component is locked to a signal that is relatively high in frequency, as compared to the baseband bandwidth, compensating means can be provided so that the information signal can still be successfully received and processed.

A radio receiver in accordance with the present invention can operate with any modulation system which either transmits a carrier or is susceptible to regeneration of a carrier within the receiver.

Although several embodiments of the invention have been illustrated in the accompanying drawings and described in the foregoing detailed description, it will be understood that the invention is not limited to the embodiments disclosed, but is capable of numerous rearrangements, modifications, and substitutions without departing from the scope of the invention.

What is claimed is:

1. A radio receiver in which a first signal is frequency translated to produce a second signal, comprising:
   (a) means for generating a first clock signal,
   (b) means responsive to a control signal for generating a second clock signal by adding clock pulses to said first clock signal,
   (c) means responsive to said control signal for generating said second clock signal by deleting clock pulses from said first clock signal,
   (d) means for generating a sampling clock signal by dividing the rate of said second clock signal,
   (e) means for sampling said first signal at the rate of said sampling clock signal to frequency translate said first signal thereby generating the second signal which includes a carrier component,
   (f) means for extracting said carrier component from said second signal,
   (g) means for generating said control signal responsive to a phase difference between said carrier component and a third signal having a predetermined frequency, and
   (h) means for phase locking said carrier component to said third signal by varying the rate of said sampling clock signal in response to said control signal.

2. A radio receiver as recited in claim 1 further including:
   (a) means for generating a fourth signal by amplifying a received signal,
   (b) means for producing a fifth signal by band-pass filtering said fourth signal, and
   (c) means for generating said first signal by amplifying said fifth signal.

3. A radio receiver as recited in claim 1 wherein said means for generating a first clock signal comprises:
   (a) mean for generating a reference clock signal,
   (b) means for generating a frequency selection signal,
   (c) means responsive to said frequency selection signal for generating a third clock signal by adding clock pulses to said reference clock signal,
   (d) means responsive to said frequency selection signal for generating said third clock signal by deleting clock pulses from said reference clock signal, and
   (e) means responsive to said frequency selection signal for generating said first clock signal by dividing the rate of said third clock signal.

4. A radio receiver as recited in claim 1 wherein said second means for sampling comprises:
   (a) an input terminal receiving said first signal,
   (b) an output terminal, and
   (c) means for alternately connecting and disconnecting said input terminal and said output terminal in response to said sampling clock signal.

5. A radio receiver in which a first signal is frequency translated to produce a second signal, comprising:
   (a) first means for generating a sampling clock signal,
   (b) second means for sampling said first signal at the rate of said sampling clock signal to frequency translate said first signal thereby generating the second signal having a carrier component, said second means comprising:
   (i) an input terminal receiving said first signal,
   (ii) an output terminal,
   (iii) an inverter having an input port and an output port, said input port connected to said input terminal,
   (iv) means for connecting said output terminal alternately to said input terminal and said output port of said inverter in response to said sampling clock signal, to generate said second signal at said output terminal, and
   (c) third means for varying the rate of said sampling clock signal to phase lock said carrier component of said second signal to a third signal having a predetermined frequency.

6. A radio receiver in which a received signal is frequency translated to produce a baseband signal, comprising:
   (a) first means for generating a first clock signal,
   (b) second means responsive to said first clock signal for sampling said received signal to frequency translate said received signal and generate an intermediate frequency signal,
   (c) means for generating a reference clock signal,
   (d) means responsive to a control signal for generating a second clock signal by adding clock pulses to said reference clock signal,
   (e) means responsive to said control signal for generating said second clock signal by deleting clock pulses from said reference clock signal,
   (f) means for generating a third clock signal by dividing the rate of said second clock signal,
   (g) means responsive to said third clock signal for sampling said intermediate frequency signal to thereby frequency translate said intermediate frequency signal and generate said baseband signal with a carrier component,
   (h) means for extracting said carrier component from said baseband signal,
   (i) means for generating said control signal responsive to a phase difference between said carrier component and a first signal having a predetermined frequency, and
   (j) means for phase locking said carrier component to said first signal by varying the rate of said third clock signal in response to said control signal.

7. A radio receiver in which a received signal is frequency translated to produce a baseband signal, comprising:
   (a) first means for generating a first clock signal,
   (b) second means for sampling said received signal to frequency translate said received signal and generate an intermediate frequency signal, said second means comprising:
   (i) an input terminal receiving said received signal,
   (ii) an output terminal,
   (iii) an inverter having an input port and an output port, said input port connected to said input terminal,
   (iv) means for connecting said output terminal alternately between said input terminal and said output port of said inverter in response to said first clock signal to generate said intermediate frequency signal at said output terminal,
   (c) third means for generating a third clock signal,
   (d) fourth means responsive to said third clock signal for sampling said intermediate frequency signal to thereby frequency translate said intermediate frequency signal and generate said baseband signal with a carrier component, and (e) fifth means for varying the rate of said third clock signal to phase lock said carrier component of said baseband signal to a first signal having a predetermined frequency.

8. A radio receiver in which a received signal is frequency translated to produce a baseband signal, comprising:
(a) means for generating a reference clock signal,
(b) means for generating a frequency selection signal,
(c) means responsive to said frequency selection signal for generating a first clock signal by adding clock pulses to said reference clock signal,
(d) means responsive to said frequency selection signal for generating said first clock signal by deleting clock pulses from said reference clock signal,
(e) means responsive to said frequency selection signal for generating a second clock signal by dividing the rate of said first clock signal,
(f) means responsive to said second clock signal for sampling said received signal to frequency translate said received signal and generate an intermediate frequency signal,
(g) means for generating a third clock signal,
(h) means responsive to said third clock signal for sampling said intermediate frequency signal to thereby frequency translate said intermediate frequency signal and generate said baseband signal with a carrier component, and
(i) means for varying the rate of said third clock signal to phase lock said carrier component of said baseband signal to a first signal having a predetermined frequency.

9. A radio receiver as recited in claim 8 wherein said means for varying the rate comprises:
(a) means for extracting said carrier component from said baseband signal,
(b) means for generating a control signal responsive to a phase difference between said carrier component and said first signal, and
(c) means for varying the rate of said third clock signal responsive to said control signal, to phase lock said carrier component to said first signal.

10. A radio receiver as recited in claim 8 wherein said means responsive to the second clock signal comprises:
(a) an input terminal receiving said received signal,
(b) an output terminal, and
(c) means for alternately connecting and disconnecting said input terminal and said output terminal in response to said second clock signal.

11. A radio receiver as recited in claim 8 wherein said means responsive to the third clock signal comprises:
(a) an input terminal receiving said intermediate frequency signal,
(b) an output terminal, and
(c) means for alternately connecting and disconnecting said input terminal and said output terminal in response to said third clock signal.

12. A radio receiver as recited in claim 8 further including means for maintaining the amplitude of said intermediate frequency signal within predetermined limits.

13. A radio received as recited in claim 8 further including a first filter for separating said intermediate frequency signal from additional signals generated by said sampling of said received signal.

14. A radio received as recited in claim 13 wherein said first filter is a band-pass filter.

15. A radio receiver as recited in claim 8 further including a filter for separating said baseband signal from additional signals generated by said sampling of said intermediate frequency signal.

16. A radio receiver as recited in claim 15 wherein said filter is a low-pass filter.

17. A radio receiver as recited in claim 8 further including:
(a) means for generating a second signal by amplifying an input signal,
(b) means for producing a third signal by band-pass filtering said second signal, and
(c) means for generating said received signal by amplifying said third signal.

18. A radio receiver as recited in claim 8 further including a matched filter having said baseband signal as an input.

19. A method for demodulating a radio signal comprising the steps of:
(a) generating a reference clock signal,
(b) adding clock pulses to said reference clock signal in response to a control signal to generate a first signal,
(c) deleting clock pulses from said reference clock signal in response to said control signal to generate said first signal,
(d) generating a second signal by producing a pulse following the generation of each group of a predetermined number of pulses of said first signal,
(e) convolving said second signal with said radio signal to produce a third signal comprising a family of nonoverlapping spectrum component signals,
(f) filtering said third signal to extract a first component signal from said family of nonoverlapping spectrum component signals, said first component signal having a carrier component,
(g) extracting said carrier component from said first component signal,
(h) phase comparing said carrier component and a fourth signal having a predetermined frequency to detect a phase difference therebetween,
(i) generating said control signal in response to said phase difference, and
(j) phase locking said carrier component to said fourth signal by varying the rate of said second signal in response to said control signal.

20. A method for demodulating a radio signal comprising the steps of:
(a) generating a periodic first signal,
(b) convolving said first signal with said radio signal to produce a second signal comprising a first family of nonoverlapping spectrum component signals,
(c) filtering said second signal to extract a first component signal from said first family of nonoverlapping spectrum component signals,
(d) generating a reference clock signal,
(e) adding clock pulses to said reference clock signal in response to a control signal to generate a third signal,
(f) deleting clock pulses from said reference clock signal in response to said control signal to generate said third signal,
(g) generating a fourth signal by producing a pulse following the generation of each group of a predetermined number of pulses of said third signal,
(h) convolving said fourth signal with said first component signal to produce a fifth signal comprising a second family of nonoverlapping spectrum component signals,
(i) filtering said fifth signal to extract a second component signal from said second family of nonoverlapping spectrum component signals, said second component signal having a carrier component,
(j) extracting said carrier component from said second component signal,
(k) phase comparing said carrier component extracted from said second component signal and a sixth signal having a predetermined frequency to detect a phase difference,
(l) generating said control signal in response to said phase difference, and
(m) phase locking the carrier component of said second component signal to said sixth signal by varying the rate of said fourth signal in response to said control signal.

21. A method for demodulating a radio signal comprising the steps of:
(a) generating a reference clock signal,
(b) generating a frequency selection signal,
(c) adding clock pulses to said reference clock signal in response to said frequency selection signal to generate a first signal,
(d) deleting clock pulses from said reference clock signal in response to said frequency selection signal to generate said first signal,
(e) generating a second signal by producing a pulse following the generation of each group of a number of pulses of said first signal, said number being determined by said frequency selection signal,
(f) convolving said second signal with said radio signal to produce a third signal comprising a first family of nonoverlapping spectrum component signals,
(g) filtering said third signal to extract a first component signal from said first family of nonoverlapping spectrum component signals,
(h) generating a periodic fourth signal,
(i) convolving said fourth signal with said first component signal to produce a fifth signal comprising a second family of nonoverlapping spectrum component signals,
(j) filtering said fifth signal to extract a second component signal from said second family of nonoverlapping spectrum component signals, said second component signal having a carrier component, and
(k) phase locking said carrier component of said second component signal to a sixth signal having a predetermined frequency by varying the rate of said fourth signal.

22. A method for demodulating a radio signal as recited in claim 21 further including the step of setting said second predetermined frequency of said fourth signal at zero.

23. A method for demodulating a radio signal as recited in claim 21 wherein the step of convolving said first signal comprises sampling said radio signal at the rate of said first signal.

24. A method for demodulating a radio signal as recited in claim 21 wherein the step of convolving said second signal comprises sampling said first component signal at the rate of said second signal.

25. A radio receiver in which a received signal is frequency translated to produce a base band signal, comprising:
first means for generating a first clock signal,
second means responsive to said first clock signal and for sampling said received signal to frequency translate said received signal and generate an intermediate frequency signal,
third means for generating a second clock signal,
an input terminal receiving said intermediate frequency signal,
an output terminal,
an inverter having an input port and an output port, said input port connected to said input terminal,
fourth means for connecting said output terminal alternately to said input terminal and said output port of said inverter in response to said second clock signal, and
fifth means for varying the rate of said second clock signal to phase lock said carrier component to said baseband signal to a first signal having a predetermined frequency.

* * * * *